US011846835B2

(12) United States Patent
Bhaskaran et al.

(10) Patent No.: US 11,846,835 B2
(45) Date of Patent: Dec. 19, 2023

(54) DISPLAY APPARATUS

(71) Applicant: E INK CORPORATION, Billerica, MA (US)

(72) Inventors: Harish Bhaskaran, Horton-cum-Studley (GB); Peiman Hosseini, Bicester (GB); Ben Broughton, Marston (GB)

(73) Assignee: E Ink Corporation, Billerica, MA (US)

( * ) Notice: Subject to any disclaimer, the term of this patent is extended or adjusted under 35 U.S.C. 154(b) by 1224 days.

(21) Appl. No.: 16/469,167

(22) PCT Filed: Oct. 31, 2017

(86) PCT No.: PCT/GB2017/053270
§ 371 (c)(1),
(2) Date: Jun. 13, 2019

(87) PCT Pub. No.: WO2018/109427
PCT Pub. Date: Jun. 21, 2018

(65) Prior Publication Data
US 2019/0384075 A1    Dec. 19, 2019

(30) Foreign Application Priority Data
Dec. 13, 2016 (GB) ..................... 1621178

(51) Int. Cl.
*G02F 1/01* (2006.01)
*G02F 1/00* (2006.01)
(Continued)

(52) U.S. Cl.
CPC ............... *G02F 1/01* (2013.01); *B42D 25/36* (2014.10); *C09K 5/14* (2013.01); *G02F 1/0054* (2013.01);
(Continued)

(58) Field of Classification Search
None
See application file for complete search history.

(56) References Cited

U.S. PATENT DOCUMENTS 5,896,005 A    4/1999  Gurvitch et al.
6,819,469 B1  11/2004  Koba
(Continued)

FOREIGN PATENT DOCUMENTS

EP          3 203 309         8/2017
WO     WO 2015/097468         7/2015
(Continued)

OTHER PUBLICATIONS

Collings, N. et al., "The Applications and Technology of Phase-Only Liquid Crystal on Silicon Device," Journal of Display Technology, vol. 7, No. 3, Mar. 2011, pp. 1-9.
(Continued)

*Primary Examiner* — Stephone B Allen
*Assistant Examiner* — Tamara Y. Washington
(74) *Attorney, Agent, or Firm* — Rajesh Vallabh

(57) ABSTRACT

A display apparatus includes a reflective layer with reflective material. One or more stacks of additional layers are provided on the reflective layer. Each stack has an optically switchable layer. A plurality of switching elements are located on a side of the reflective layer opposite to the one or more stacks or form part of the reflective layer. Each switching element is operable to apply heating to a switchable portion of the optically switchable layer and thereby change an appearance of the switchable portion when viewed from a viewing side of the display apparatus. The apparatus applies the heating by driving an electrical current through the switching element to generate Joule heating in the switching element. The electrical current flows in an electrical circuit including a portion of the reflective layer.

21 Claims, 17 Drawing Sheets

(51) Int. Cl.
    *H10N 70/20*         (2023.01)
    *H10N 70/00*         (2023.01)
    *B42D 25/36*         (2014.01)
    *C09K 5/14*          (2006.01)
    *C09K 5/04*          (2006.01)
    *H04N 9/31*          (2006.01)

(52) U.S. Cl.
    CPC ....... *H10N 70/231* (2023.02); *H10N 70/8613* (2023.02); *H10N 70/882* (2023.02); *H10N 70/8825* (2023.02); *H10N 70/8828* (2023.02); *G02F 1/0147* (2013.01); *G02F 2202/10* (2013.01); *G02F 2203/12* (2013.01); *H04N 9/312* (2013.01)

(56) References Cited

U.S. PATENT DOCUMENTS

| | | |
|---|---|---|
| 2007/0125997 A1 | 6/2007 | Kim |
| 2015/0098032 A1 | 4/2015 | Park |
| 2018/0284497 A1* | 10/2018 | Hosseini ........... G02F 1/133528 |
| 2019/0198820 A1 | 6/2019 | Ko et al. |

FOREIGN PATENT DOCUMENTS

| | | |
|---|---|---|
| WO | WO 2015/097469 | 7/2015 |
| WO | WO 2017/064509 | 4/2017 |

OTHER PUBLICATIONS

Hosseini, Peiman et al., "An Optoelectroic Framework Enabled by Low-Dimensional Phase-Change Films," Nature, vol. 511, Jul. 10, 2014, pp. 206-211.

Great Britain Search Report dated Jun. 8, 2017 issued in Great Britain Patent Application No. 1621178.1, 3 pp.

International Search Report dated Jan. 24, 2018 issued in PCT International Patent Application No. PCT/GB2017/053270, 2 pp.

Jepsen, Mary Lou, "Liquid Crystal on Silicon," Nature Photonics, vol. 1, May 2007, pp. 276-277.

Underwood, Ian, "A Review of Microdisplay Technologies," Digest, Electronic Information Displays Conference, 2000, 7 pp.

Zhang, Zichen et al., "High Quality Assembly of Phase-Only Liquid Crystal on Silicon (LCOS) Devices," Journal of Display Technology, vol. 7, No. 3, Mar. 2011, pp. 120-126.

\* cited by examiner

DISPLAY APPARATUS

This application is the U.S. national phase of International Application No. PCT/GB2017/053270 filed Oct. 31, 2017 which designated the U.S. and claims priority to Great Britain Patent Application No. 1621178.1 filed Dec. 13, 2016, the entire contents of each of which are hereby incorporated by reference.

The invention relates to a display apparatus, particularly for use as a spatial light modulator in a microdisplay, in which an optically switchable layer is provided above a reflective layer and backplane switching electronics are provided in an integrated circuit behind the reflective layer.

Silicon backplane microdisplays have found extensive commercial use as the primary light modulating elements in rear projection TVs, pico-projectors, head-up displays (HUDs) and head-worn or near to eye displays ("Underwood, I. A review of microdisplay technologies. Digest, Electronic Information Displays Conference, (2000)). The most promising of the several optical modulation technologies used with silicon (typically CMOS) backplanes are digital micromirror devices (DMDs) and liquid crystal on silicon (LCoS) devices (Nature Photonics 1, 276-277 (2007)). Of these, LCoS devices have found applications outside two-dimensional image display via projection optics, due their configurability for both amplitude and phase modulation (Journal of Display Technology, vol. 7, no. 3, March 2011). This allows for potential application of these devices in two and three-dimensional holographic projection systems, adaptive optics (e.g. wavefront correction), and photonic devices (e.g. beam steering elements, optical interconnects, optical correlators). Performance of LCoS devices has been limited, however, by the fact that of the two applicable liquid crystal (LC) material types, nematics offer continuous phase or amplitude control at each pixel, but are slow to switch, while ferroelectrics offer fast (sub ms) switching but between only two binary states. Additionally, the thickness of liquid crystal material required to effect the desired modulation (typically 3-5 µm) and the elastic nature of the LC means that the minimum independently addressable area is also on this scale, limiting the achievable diffraction angles at visible wavelengths and therefore projected image size.

It is an object of the invention to provide an alternative display apparatus that can be manufactured in a compact manner and/or at low cost, and/or which is capable of at least partially addressing one or more of the problems mentioned above in relation to the prior art.

According to an aspect of the invention, there is provided a display apparatus, comprising: a reflective layer comprising reflective material, and one or more stacks of additional layers provided on the reflective layer, wherein each stack comprises an optically switchable layer; a plurality of switching elements located on a side of the reflective layer opposite to the one or more stacks or forming part of the reflective layer, each switching element being operable to apply heating to a switchable portion of the optically switchable layer and thereby change an appearance of the switchable portion when viewed from a viewing side of the display apparatus, wherein the apparatus is configured to apply the heating by driving an electrical current through the switching element to generate Joule heating in the switching element, wherein the electrical current flows in an electrical circuit comprising a portion of the reflective layer.

Thus, an arrangement is provided in which the reflective layer serves both as a mirror for reflecting incident light back out towards a user, and as part of an electrical arrangement that is used to controllably switch an array of switchable portions defining pixels of the display apparatus. This dual use of the reflective layer facilitates manufacture at low cost and allows the display apparatus to be provided in compact form. This approach also provides the basis for additional advantages achievable by patterning the reflective layer (i.e. providing a reflective layer that is not simply a continuous planar layer of homogeneous composition).

In an embodiment, the reflective layer comprises a pattern of regions of different thermal conductivity, the pattern being such as to increase the thermal resistance between each region of the reflective layer that correspond to a switching element and each region of the reflective layer that corresponds to a different switching element.

This thermal isolation reduces or prevents undesirable spreading of heat laterally via the reflective layer, which can cause cross-talk between different switching elements.

In an embodiment, the reflective layer is patterned so that each switching element comprises a localized path of high electrical resistance formed within the reflective layer, the localized path being such that at least 25% of the Joule heating provided by the switching element is provided by Joule heating within the localized path.

By providing a significant portion of, a majority of, or even substantially all of, the heating via the localized path within the reflective layer, the need for other, separate heating elements (e.g. below the reflective layer) is reduced or removed, thereby reducing manufacturing cost and/or increasing device compactness.

According to an alternative aspect of the invention, there is provided a display apparatus, comprising: a reflective layer comprising reflective material, and one or more stacks of additional layers provided on the reflective layer, wherein each stack comprises an optically switchable layer; a plurality of switching elements located on a side of the reflective layer opposite to the one or more stacks or forming part of the reflective layer, each switching element being operable to apply a signal through the reflective layer to a switchable portion of the optically switchable layer and thereby change an appearance of the switchable portion when viewed from a viewing side of the display apparatus, wherein the optically switchable layer comprises a phase change material, the phase change material being switchable between a plurality of stable states, each of the stable states having a different refractive index relative to each of the other stable states, the phase change material being switchable by application of heat between the plurality of stable states; and the optically switchable layer is configured such that switching of the optically switchable layer causes the apparatus to provide one or both of the following effects for incident radiation within a predetermined frequency range: i) a change in reflectivity of a factor of at least 50; or ii) a change in phase that is within 5% of $n\pi/2$ radians, where n is an integer.

The inventors have recognised that display apparatus having this particular architecture, based on reflecting incident light through an optically switchable layer, can provide high contrast narrowband performance surprisingly effectively, particularly where the optically switchable layer comprises a phase change material switchable by application of heat between a plurality of stable states having different refractive indices relative to each of the other stable states.

According to an alternative aspect of the invention, there is provided a display apparatus, comprising: a reflective layer comprising reflective material, and one or more stacks of additional layers provided on the reflective layer, wherein each stack comprises an optically switchable layer; a plurality of switching elements located on a side of the reflective layer opposite to the one or more stacks or forming part of the reflective layer, each switching element being operable to apply a signal through the reflective layer to a switchable portion of the optically switchable layer and thereby change an appearance of the switchable portion when viewed from a viewing side of the display apparatus; and an integrated circuit layer formed on a side of the reflective layer opposite to the one or more stacks, the integrated circuit layer comprising at least one integrated circuit chip that comprises one or more of: 1) all or a portion of each of a plurality of the switching elements; 2) electronics for driving a plurality of the switching elements, wherein the optically switchable layer comprises a phase change material, the phase change material being switchable between a plurality of stable states, each of the stable states having a different refractive index relative to each of the other stable states, wherein the phase change material is switchable by application of heat between the plurality of stable states.

Thus, an arrangement is provided which can be manufactured at low cost, for example using minimal adaptation of silicon backplane CMOS arrangements known for LCoS devices.

The invention will now be further described, by way of example, with reference to the accompanying drawings, in which.

Figure 1:
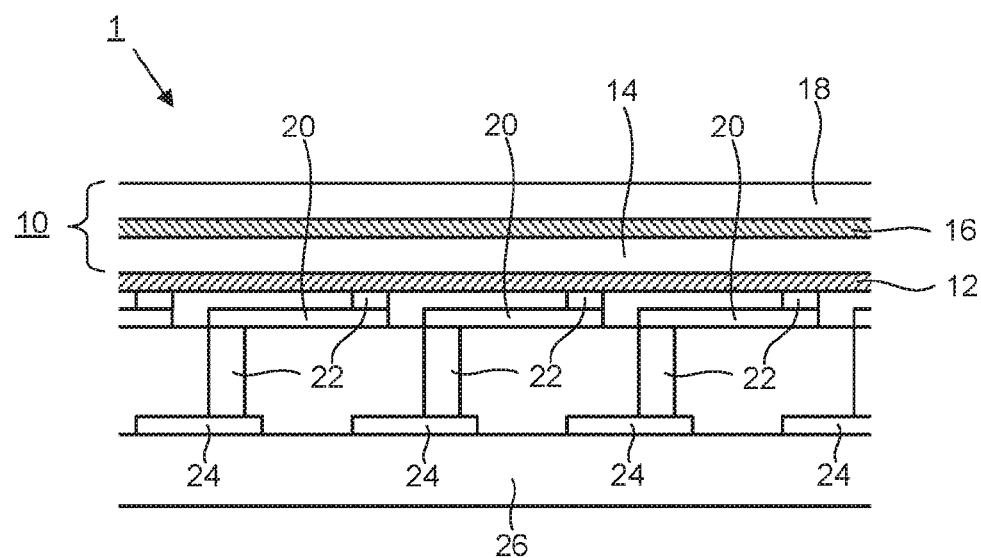
FIG. 1 is a schematic side sectional view of a display apparatus having a reflective layer comprising a continuous planar layer of reflective material.

Throughout this specification, the terms "optical" and "light" are used, because they are the usual terms in the art relating to electromagnetic radiation, but it is understood that in the context of the present specification they are not limited to visible light. It is envisaged that the invention can also be used with wavelengths outside of the visible spectrum, such as with infrared and ultraviolet light.

Certain embodiments of the invention are based on newly recognised applications of a novel phase-change material (PCM) based reflective display technology, described for example in Nature 511, 206-211, 2014; WO2015097468A1), and in which the optical appearance is determined by the thickness of a stack of sub-micron scale solid-state layers, the lower of which is a reflective layer (also referred to as a mirror layer). In such devices, the active PCM layer is only approximately 10 nm thick, and by switching it between its amorphous and crystalline states via optical, thermal or electrical means, the wavelength dependent complex refractive index is altered significantly. This results in fast (potentially sub ms), repeatable, reversible switching between two bright, vividly coloured, stable states, both of which require no energy to maintain. The nanoscale thickness of the PCM layer means that nanoscale spatial patterning is possible. A method of switching independent, larger area (10-100 micron square) regions of a PCM based optical stack is disclosed in European patent application EP16000280.4, in which microheater elements are provided in each pixel region behind, and electrically isolated from, the reflective layer.

Embodiments of the present disclosure relate to a display apparatus 1, examples of which are depicted in most detail in FIGS. 1-7. The display apparatus 1 comprises a reflective layer 12. The reflective layer 12 comprises reflective material such as a metal. Metals are known to provide good reflectivity (when sufficiently thick) and also have high thermal and electrical conductivities. The reflective layer 12 may have a reflectance of 50% or more, optionally 90% or more, optionally 99% or more, with respect to visible light, infrared light, and/or ultraviolet light. The reflective layer 12 may comprise a thin metal film, composed for example of Au, Ag, Al, or Pt. If this layer is to be partially reflective then a thickness in the range of 5 to 15 nm might be selected, otherwise the layer is made thicker, such as 100 nm, to be substantially totally reflective.

One or more stacks 10 of additional layers are provided on the reflective layer 12. Each stack 10 comprises an optically switchable layer 16. The optically switchable layer 16 is a layer formed from a material which is capable of being switched so as to cause a region of the display to change its appearance. In the particular examples shown in FIG. 1-7 a single stack 10 is provided. In other embodiments, plural stacks 10 are provided. Each stack 10 may correspond to a pixel or a sub-pixel of the display.

In an embodiment the optically switchable layer 16 comprises a phase change material (PCM). The PCM is switchable by application of an electrical signal or heat between a plurality of stable states. Each stable state has a different refractive index (optionally including a different imaginary component of the refractive index, and thereby a different absorbance) relative to each of the other stable states. The optically switchable layer 16 may however be formed in other ways, for example so as to implement an LCD or an OLED display. In an embodiment all layers in each stack 10 are solid-state and configured so that their thicknesses as well as refractive index and absorption properties combine so that the different states of the optically switchable layer (e.g. PCM) result in different, visibly distinct, reflection spectra. Optical devices of this type are described in Nature 511, 206-211 (10 Jul. 2014), WO2015/097468A1, WO2015/097469A1, EP16000280.4 and PCT/GB2016/053196.

In an embodiment the PCM comprises, consists essentially of, or consists of, one or more of the following: an oxide of vanadium (which may also be referred to as VOx); an oxide of niobium (which may also be referred to as NbOx); an alloy or compound comprising Ge, Sb, and Te; an alloy or compound comprising Ge and Te; an alloy or compound comprising Ge and Sb; an alloy or compound comprising Ga and Sb; an alloy or compound comprising Ag, In, Sb, and Te; an alloy or compound comprising In and Sb; an alloy or compound comprising In, Sb, and Te; an alloy or compound comprising In and Se; an alloy or compound comprising Sb and Te; an alloy or compound comprising Te, Ge, Sb, and S; an alloy or compound comprising Ag, Sb, and Se; an alloy or compound comprising Sb and Se; an alloy or compound comprising Ge, Sb, Mn, and Sn; an alloy or compound comprising Ag, Sb, and Te; an alloy or compound comprising Au, Sb, and Te; and an alloy or compound comprising Al and Sb (including the following compounds/alloys in any stable stoichiometry: GeSbTe, VOx, NbOx, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb). Preferably, the PCM comprises one of $Ge_2Sb_2Te_5$ and $Ag_3In_4Sb_{76}Te_{17}$. Furthermore, any of the above materials can comprise one or more dopants, such as C or N. Other materials may be used.

PCMs are known that undergo a drastic change in both the real and imaginary refractive index when switched between amorphous and crystalline phases. The switching can be achieved for example by heating induced by suitable electric pulses or by a light pulse from a laser light source, or, as in embodiments described below, by thermal conduction of heat generated by a switching element in thermal contact with the PCM. There is a substantial change in the refractive index when the material is switched between amorphous and crystalline phases. The material is stable in either state. Switching can be performed an effectively limitless number of times. However, it is not essential that the switching is reversible.

A further enhancement applicable to all embodiments using PCM is that the PCM does not have to be switched simply between a fully crystalline and a fully amorphous state. A mixture of phases can be achieved, such as 20% crystalline, 40% crystalline etc. The resulting effective refractive index of the material is somewhere between the two extremes of fully crystalline and fully amorphous depending on the degree of partial crystallisation. Between four and eight distinct mixed phases can be readily achieved, having the corresponding number of different detectable reflectivities, but with appropriate control the number can be much higher, such as 128.

Although some embodiments described herein mention that the material layer is switchable between two states such as crystalline and amorphous phases, the transformation could be between any two solid phases, including, but not limited to: crystalline to another crystalline or quasi-crystalline phase or vice-versa; amorphous to crystalline or quasi-crystalline/semi-ordered or vice versa, and all forms in between. Embodiments are also not limited to just two states.

In an embodiment, the PCM comprises $Ge_2Sb_2Te_5$ (GST) in a layer less than 200 nm thick. In another embodiment, the PCM comprises GeTe in a layer less than 100 nm thick.

The additional layers forming each stack 10 may be deposited using sputtering in the case of inorganic material layers such as the PCM, ITO, $SiO_2$, and so on, which can be performed at a relatively low temperature of 100 C or even 70 C or lower. Polymeric layers can be formed by spin-coating and curing. Additional layers may also be provided as necessary. The low temperature process means that the optical apparatus 1 does not have to be fabricated at the same time as the article comprising the optical apparatus 1; the optical apparatus 1 can be retro-fitted as a surface coating applied later.

In an embodiment, the one or more stacks 10 of additional layers further comprises a spacer layer 14 (which may comprise a single layer or a plurality of different layers) provided between the reflective layer 12 and the optically switchable layer 16 in the same stack 10 as the spacer layer 14. The thickness and refractive index of the material or materials forming the spacer layer 14 are chosen to create a desired spectral response (via interference).

Additionally or alternatively, in various embodiments, each of the one or more stacks 10 of additional layers further comprises a capping layer 18 (which may comprise a single layer or a plurality of different layers). The optically switchable layer 16 in each stack 10 is provided between the capping layer 18 and the reflective layer 12. As with the spacer layer 14, the thickness and refractive index of the material or materials forming the capping layer 18 are chosen to create a desired spectral response (via interference and/or absorption). Arrangements in which the spacer layer 14 and/or the capping layer 18 each comprise two or more layers of different material having different complex refractive indices, so as to expand the range of colours and/or other optical effects producible by the display apparatus 1, are discussed in PCT/GB2016/053196.

Materials which may be used to form the spacer layer 14 and the capping layer 18 may include (but are not limited to) ZnO, $TiO_2$, $SiO_2$, $Si_3N_4$, TaO and ITO.

As shown for example in FIGS. 1-7, a plurality of switching elements 20 are provided. The switching elements 20 are located on a side of the reflective layer 12 opposite to the one or more stacks 10 or form part of the reflective layer 12. Each switching element 20 is operable to apply heating to a switchable portion of the optically switchable layer 16 and thereby change an appearance of the switchable portion when viewed from a viewing side of the display apparatus 1 (from above in the examples of FIGS. 1-7). The switching elements 20 and electronics for driving the switching elements 20 are provided behind (or partially in the same layer as) the reflective layer 12. The optical performance of the apparatus 1, which is determined by the layers above the reflective layer 12, can therefore be modified independently of the switching elements 20 and electronics for driving them. No electrodes or pixel level circuitry necessary for switching are in the optical beam path.

The apparatus 1 applies the heating by driving an electrical current through the switching element 20 to generate Joule heating (resistive heating) in the switching element 20. The electrical current flows in an electrical circuit comprising a portion of the reflective layer 12. Using the reflective layer 12 as part of the circuit avoids the need to provide separate electrical elements (e.g. conductive tracks) for this purpose. The apparatus 1 can therefore be manufactured more cheaply and compactly. Furthermore, the reflective layer 12 can be patterned to provide additional advantages, as described below.

Figure 2:
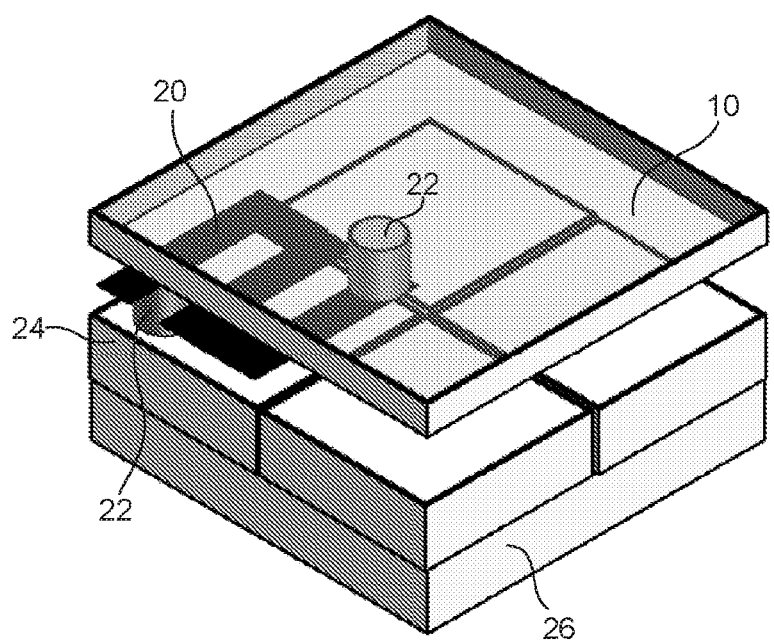
FIG. 2 is a schematic perspective view illustrating a portion of an apparatus of the type shown in FIG. 1 and showing a resistive component of a switching element behind the reflective layer.

In an embodiment, the switching element 20 comprises a resistive component in series with a portion of the reflective layer 12 that serves as a return current path. This is the case in the embodiment of FIGS. 1 and 2 and in the embodiment of FIGS. 3 and 4. In such embodiments, the resistive component will typically be positioned behind the reflective layer 12 when viewed from the viewing side of the display apparatus 1 (i.e. from above in the examples of FIGS. 1-4). In an embodiment, each switching element 20 is such that when an electrical current is driven through the resistive component to drive the switching element 20, Joule heating associated with the electrical current is higher in the resistive component than in the reflective layer. This may be achieved for example by configuring the resistive component to have a relatively high electrical resistance. A high electrical resistance may be provided for example by forming an electrical path having a serpentine, tortuous, and/or zigzagging path (so as to be relatively narrow and long), as depicted schematically in FIG. 2, and/or by forming the resistive component from a higher resistance material, and/or by forming the resistive component to be a very thin layer. Increasing the electrical resistance will increase the amount of Joule heating for a fixed applied current. It should be noted that while FIGS. 1 and 2 show the switching element 20 occupying an area within a plane between the circuit elements 24 of the backplane and the reflective layer 12, with electrically conducting vias 22 making the out-of-plane connections between these elements, this is for illustrative purposes only. The switching element's purpose is to controllably raise the temperature of a switchable portion (which may define a pixel or sub-pixel) of the optically switchable layer 16 (PCM) corresponding to the switching element 20 according to an intended temporal heat profile. The switching element 20 may assume any shape or configuration suitable for achieving this purpose. For example, the switching element 20 itself may provide the out-of-plane via between the circuit element 24 and the reflective layer 12.

Figure 8:
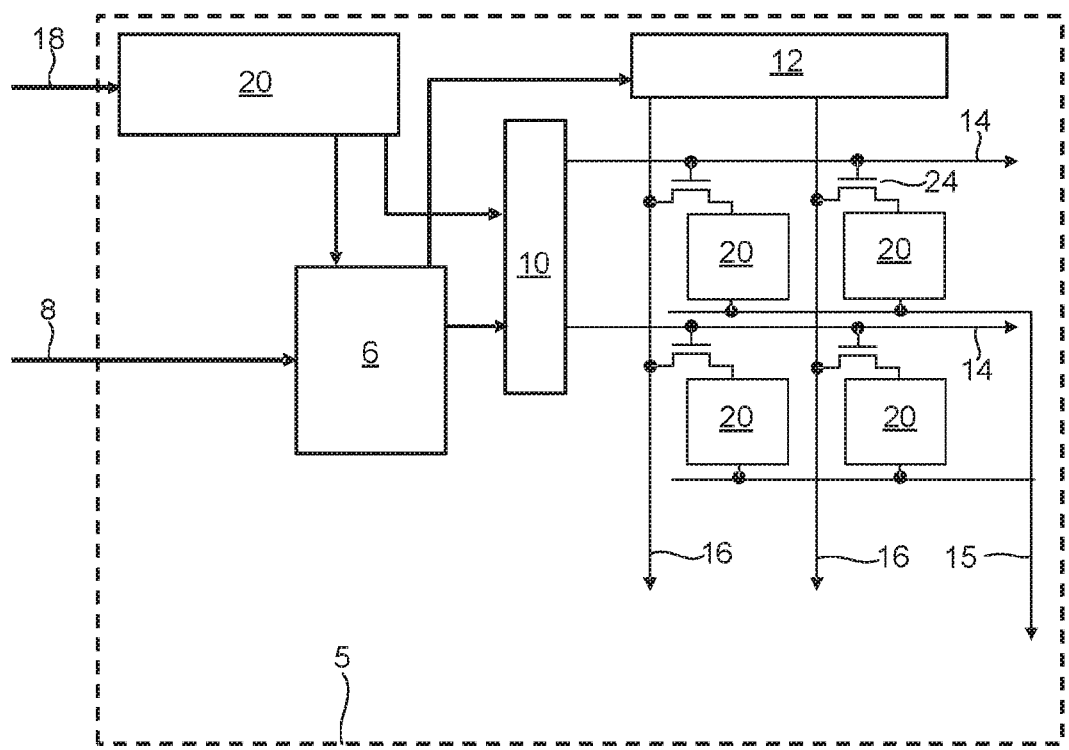
FIG. 8 depicts example driving electronics for a display apparatus according to an embodiment.

Driving electronics for driving the switching elements 20 may be provided in a variety of different ways. Typically the driving electronics will be provided behind the reflective layer 12 in silicon (typically CMOS) and may therefore be referred to as a silicon backplane. An example configuration is depicted in FIG. 8 and described in further detail below. The apparatus 1 may thus comprise an integrated circuit layer formed on a side of the reflective layer 12 opposite to the one or more stacks. The integrated circuit layer comprises at least one integrated circuit chip (a silicon backplane) that comprises one or more of: 1) all or a portion of each of a plurality of the switching elements 20; 2) electronics for driving a plurality of the switching elements 20. Thus, a plurality of the switching elements are at least partially implemented within a single integrated circuit chip.

In the embodiments of FIGS. 1-8, the driving electronics comprise circuit elements 24 and are provided on a support substrate 26. The circuit elements 24 allow the switching elements 20 to be individually addressed, allowing the apparatus 1 to selectively channel an electrical current through each of the switching elements 20 as desired. Vias 22 may be used to channel electrical current between different layers of the apparatus 1.

In the embodiment of FIGS. 1 and 2, the reflective layer 12 comprises a continuous planar layer of reflective material (having homogeneous composition). Embodiments of this type are relatively easy to manufacture.

In other embodiments, the reflective layer 12 comprises a pattern of regions of different thermal conductivity, the pattern being such as to increase the thermal resistance between each region of the reflective layer 12 that corresponds to a switching element 20 (i.e. which is above a particular switching element 20, or which forms part of a switching elements 20) and each region of the reflective layer 12 that corresponds to a different switching element. This thermal isolation reduces or prevents undesirable spreading of heat laterally via the reflective layer 12, which can cause cross-talk between different switching elements 20 (i.e. by allowing heating provided by one switching element 20 to affect a temperature of a switchable portion of the optically switchable layer 16 that is associated with a different switching element 20).

Figure 3:
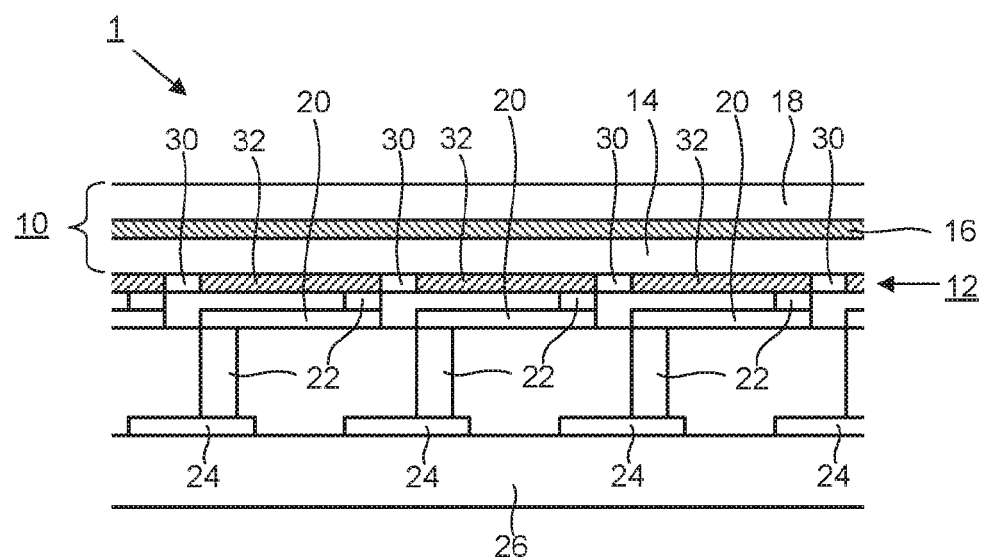
FIG. 3 is a schematic side sectional view of a display apparatus, along line A-A of FIG. 4, the display apparatus comprising a reflective layer patterned to restrict conduction of thermal energy between localized regions corresponding to different switching elements.
Figure 4:
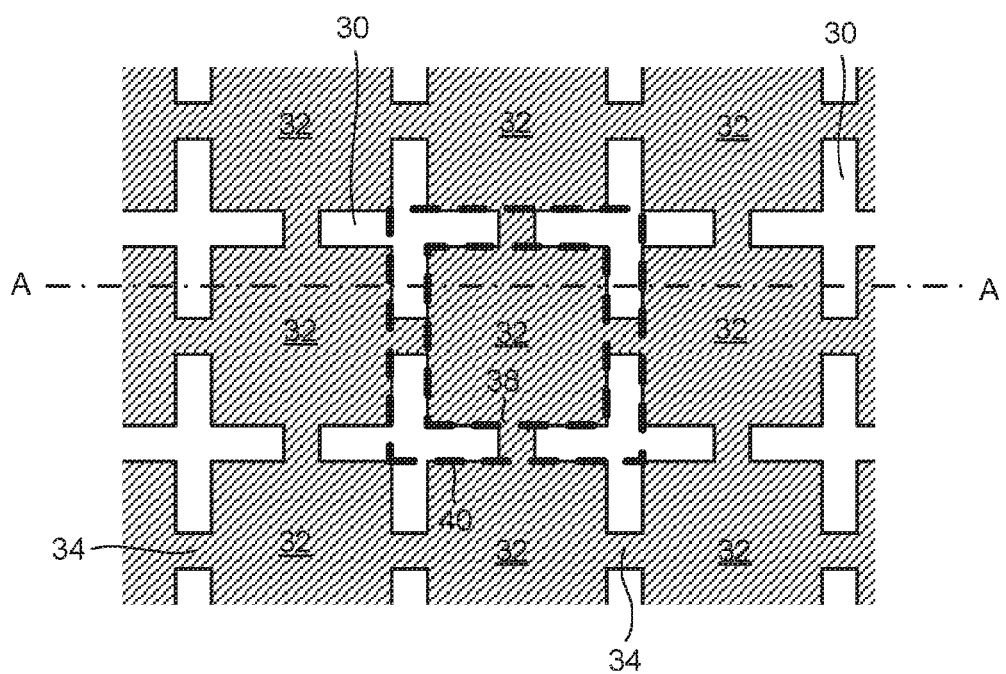
FIG. 4 is a top view of the apparatus of FIG. 3.

An example of such an embodiment is shown in FIGS. 3 and 4. In this example the reflective layer 12 is patterned so that each region 32 corresponding to a switching element 20 (above the switching element 20, or forming part of the switching element 20, for example by providing a localized path of high electrical resistance, as in the example of FIGS. 5 and 6 discussed below), comprises an inner sub-region 38 (within the innermost broken line square marked 38) that is surrounded by a thermally insulating region 40 (between the outermost broken line square marked 40 and the innermost broken line square marked 38). The thermally insulating region 40 surrounds the inner sub-region 38 (and no other inner sub-region 38) when viewed from above (i.e. in the viewing direction from a viewing side of the apparatus 1). The average thermal conductivity of the material or materials forming the inner sub-region 38 is higher than the average thermal conductivity of the material or materials forming the thermally insulating region 40. In an embodiment, the inner sub-region 38 predominantly comprises a metallic material and the thermally insulating region 40 predominantly comprises a non-metallic material (e.g. comprises non-metallic material in the white regions 30 in FIG. 4) having a lower thermal conductivity than the metallic material. The non-metallic material may comprise for example silicon oxide ($SiO_2$) or silicon nitride ($SiN_x$). In an embodiment, the non-metallic material comprises the same material as the layer immediately above the reflective layer 12 (e.g. a lowest layer of the spacer layer 14), for example $TiO_2$. The lowest layer of the spacer layer 14 will be the layer deposited after the reflective layer 12, so forming the thermally insulating regions 40 by filling gaps between the inner sub-regions 38 with the non-metallic material of the lowest layer of the spacer layer 14 facilitates manufacture.

Figure 5:
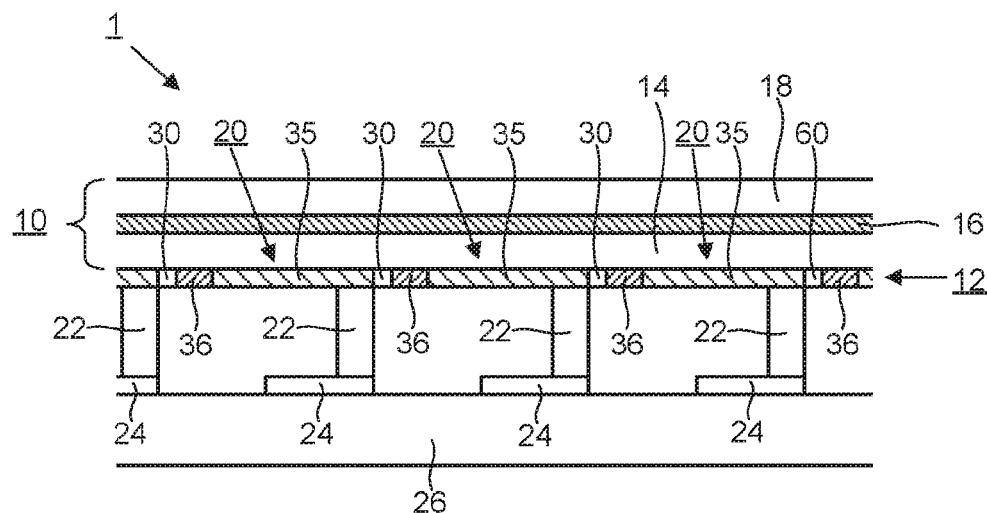
FIG. 5 is a schematic side sectional view of a display apparatus, along line B-B of FIG. 6, the display apparatus comprising a reflective layer patterned to provide localized paths of high electrical resistance within the reflective layer above each of the switching elements.
Figure 6:
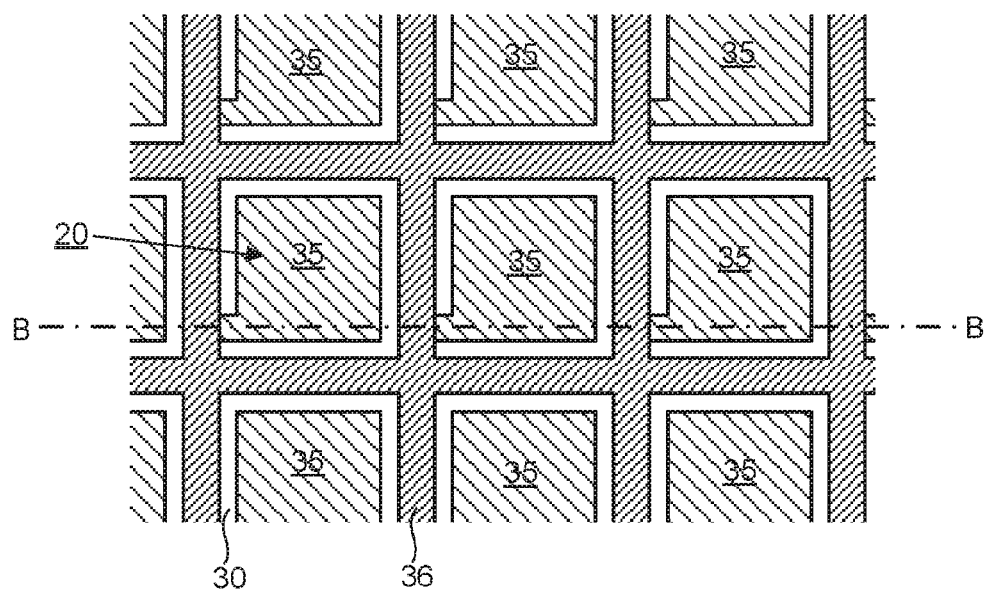
FIG. 6 is a top view of the apparatus of FIG. 5.
Figure 7:
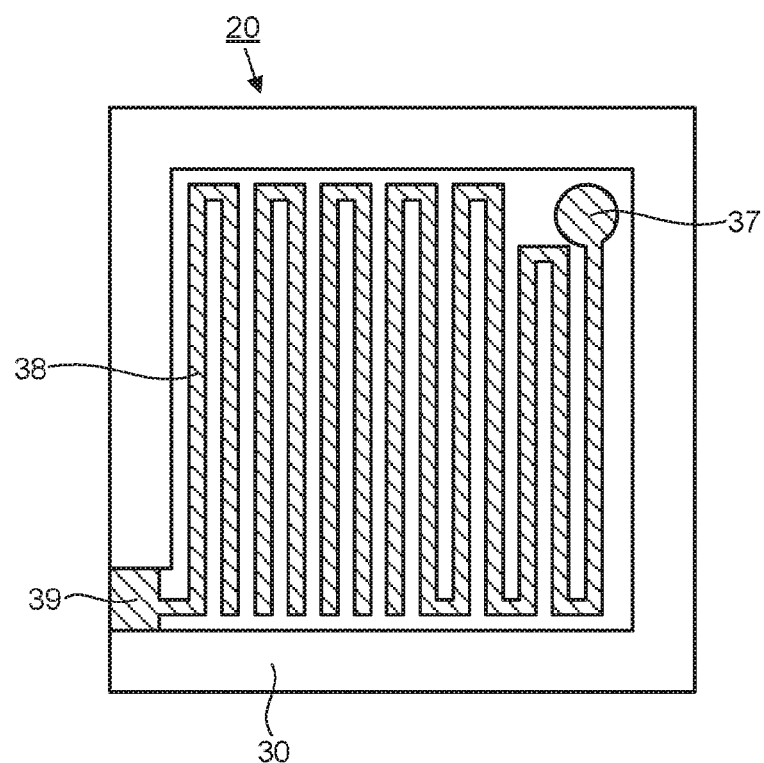
FIG. 7 is a magnified view of one of the switching elements of FIG. 6.

In an embodiment each switching element 20 comprises a localized path 35 of high electrical resistance formed within the reflective layer 12. The localized path 35 is such that at least 25%, optionally at least 50%, optionally at least 75%, optionally at least 90%, optionally at least 95%, optionally at least 99%, of the Joule heating provided by the switching element 20 is provided by Joule heating within the localized path 35. By providing a significant portion of, a majority of, or even substantially all of, the heating via the localized path 35 within the reflective 12 layer, the need for other, separate heating elements (e.g. below the reflective layer 12) is reduced or removed, thereby reducing manufacturing cost and/or increasing device compactness. An example of such an embodiment is depicted in FIGS. 5-7. In this example, the reflective layer 12 is additionally patterned so that each region of the reflective layer 12 that forms part of the switching element 20 (in this case by comprising the localized path 35 of high electrical resistance), is partially thermally isolated from other regions of the reflective layer 12 (in a similar way to the inner sub-regions 38 of the embodiment of FIGS. 3 and 4). In this embodiment the partially thermal isolation is achieved by partially surrounding the localized path 35 with a thermally insulating region 30 formed from material having a lower thermal conductivity than the material of the localized path 35. The localized path 35 is shown in detail (in exemplary form) only in FIG. 7. A connection 37 to the localized path 35 is made using via 22 to a right uppermost corner of the localized path 35 (when viewed from above, as in FIGS. 6 and 7). The localized path 35 then channels electrical current to the left lowermost corner of the localized path 35, where the localized path connects 39 to low resistance return current paths 36 provided in regions of the reflective layer 12 in between the localized paths 35 and partially surrounding thermally insulating regions 30.

Example driving electronics are depicted in FIG. 8. A two-dimensional array of independently addressable switching elements 20 (pixel regions) is provided in a silicon (typically CMOS) backplane 5. The silicon backplane 5 is an example of the single integrated chip mentioned above. Similarly to the CMOS backplane of known LCoS devices, the backplane 5 may contain all necessary circuits, such as timing controllers, row and column drivers 10 and 12, digital-to-analogue convertors 20 (DACs) (receiving power 18), and pixel circuitry 6 for receiving input image data 8 and directing the individual pixel addressing instructions in this data to the intended switching element 20 (pixel) in each frame period with the correct formatting. Each pixel region in a conventional LCoS device comprises an electrically isolated mirror acting as a reflective electrode which is charged to a signal voltage for switching the LC, and behind which the circuitry required for routing the voltage at the pixel level is positioned. In the arrangement of FIG. 8, this arrangement is modified so that a circuit element 24 in each pixel region connects to a switching element 20 that provides Joule heating (i.e. a resistive heating element) as described above. The other end of the switching element 20 is connected to a common electrode 15 which may be provided at least partially by the reflective layer 12 or may be at least partially provided within the silicon backplane 5 (i.e. within a single integrated circuit chip). The reflective layer 12 may thus act both as part of the electrical circuit for driving the switching elements and as a mirror for light incident on the display apparatus 1.

In an embodiment, the optically switchable layer 16 is configured such that switching of the optically switchable layer 16 causes the apparatus 1 to provide one or both of the following effects for incident radiation within a predetermined frequency range on the apparatus 1: i) a change in reflectivity of a factor of at least 50, optionally at least 100, optionally at least 250, optionally at least 500, optionally at least 1000; or ii) a change in phase that is within 5% of $n\pi/2$ radians, where n is an integer.

In an embodiment, the predetermined frequency range has a bandwidth of less than 100 nm, optionally less than 50 m, optionally less than 25 nm, optionally less than 10 nm, optionally less than 5 nm.

In an embodiment, the effect (i) and effect (ii) are not provided for incident radiation outside of the predetermined frequency range.

The inventors have recognised that such high contrast, narrow bandwidth response behaviour is achievable particularly effectively using PCM, despite the fact that PCMs have traditionally been used solely for achieving broadband effects such as changes in reflected colour spectra. The behaviour means the display apparatus 1 can be used efficiently in applications where such high contrast, narrow bandwidth behaviour is desirable, such as in spatial light modulators (which may be illuminated using narrowband sources such as lasers or LEDs), or in security documents such as banknotes or passports, where security features can be made to appear only when the security document is illuminated with narrowband light of the appropriate frequency.

Exemplary structures and graphs showing their high contrast narrowband behaviour are discussed below with reference to FIGS. 9-14 and 21-24.

Figure 9:
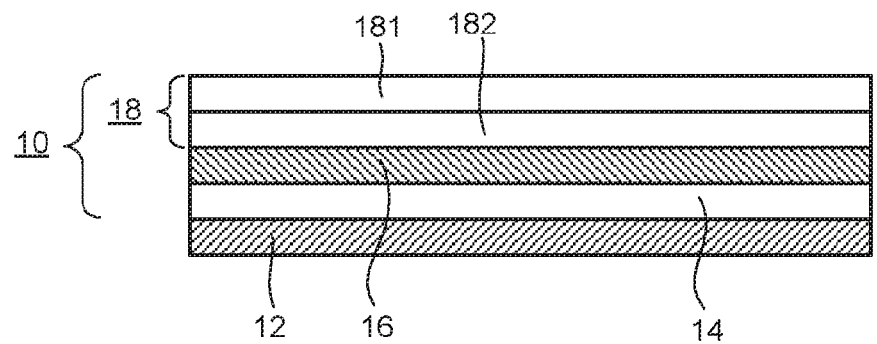
FIG. 9 depicts an example optical frontplane configured for high contrast amplitude modulation of a narrow wavelength band at 650 nm.
Figure 10:
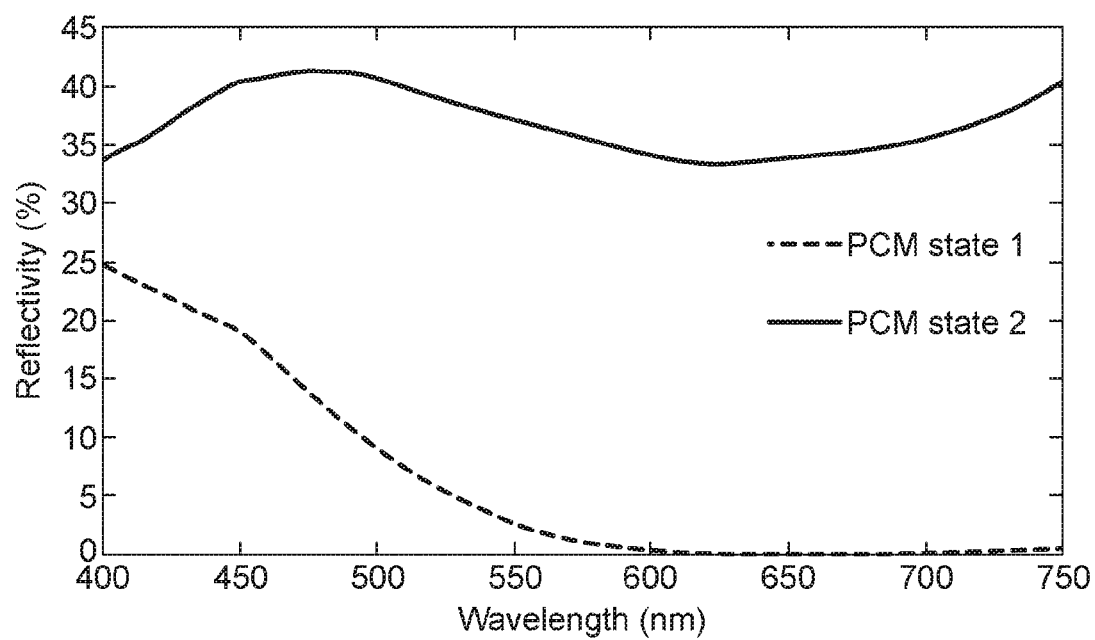
FIG. 10 is a graph showing reflectivity against wavelength for the frontplane of FIG. 9 with the optically switchable layer in two different stable states (amorphous and crystalline)

FIG. 9 depicts an example optical frontplane of the apparatus 1, comprising a reflective layer 12, and a stack 10 comprising a spacer layer 14, an optically switchable layer 16, and a capping layer 18 comprising two capping layer sub-layers 181 and 182. The frontplane may be configured to give high contrast switching for a specific narrow band of incident light wavelengths. In order to achieve this the spacer layer 14 and capping layer 18 may be composite layers (in the particular example shown, only the capping layer 18 is a composite layer), so as to increase the complexity of the internal reflections and standing wave absorption points in the stack 10, resulting in greater selectivity of the reflectivity and/or phase change at the operational wavelengths. Resultant spectra for the example stack design of FIG. 9 are shown in FIG. 10 (the solid line shows reflectivity as a function of wavelength for the optically switchable layer in a first stable state and the broken line shows the reflectivity as a function of wavelength for the optically switchable layer in a second stable state, different from the first stable state). This example achieves high contrast amplitude modulation in a narrow bandwidth of about 5 nm at 650 nm, as illustrated by the graph of contrast against wavelength of FIG. 11 (which saturates at around 3000 but much higher contrast ratios are actually achieved in the region around 650 nm).

Figure 11:
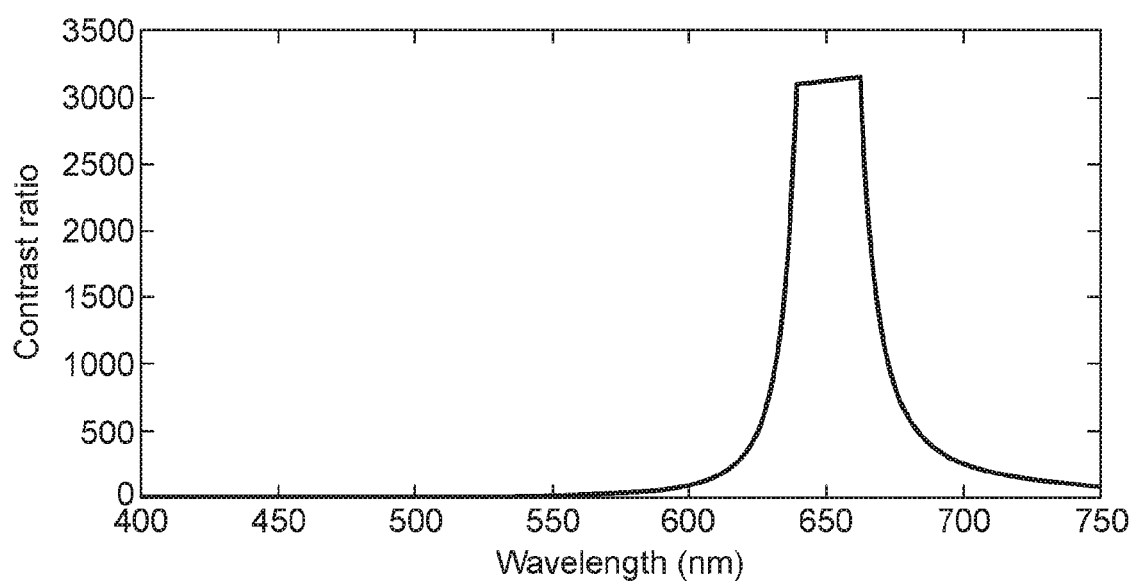
FIG. 11 is a graph showing the contrast ratio of light at visible wavelengths reflected by the apparatus of FIGS. 9 and 10 in the two states of the optically switchable layer, showing maximum contrast in a narrowband region at 650 nm.
Figure 12:
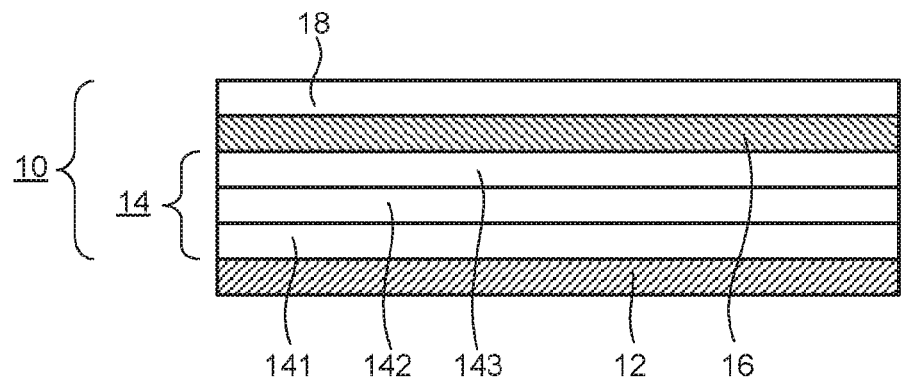
FIG. 12 depicts an example optical frontplane stack configured for high contrast amplitude modulation of a narrow wavelength band at 450 nm.
Figure 13:
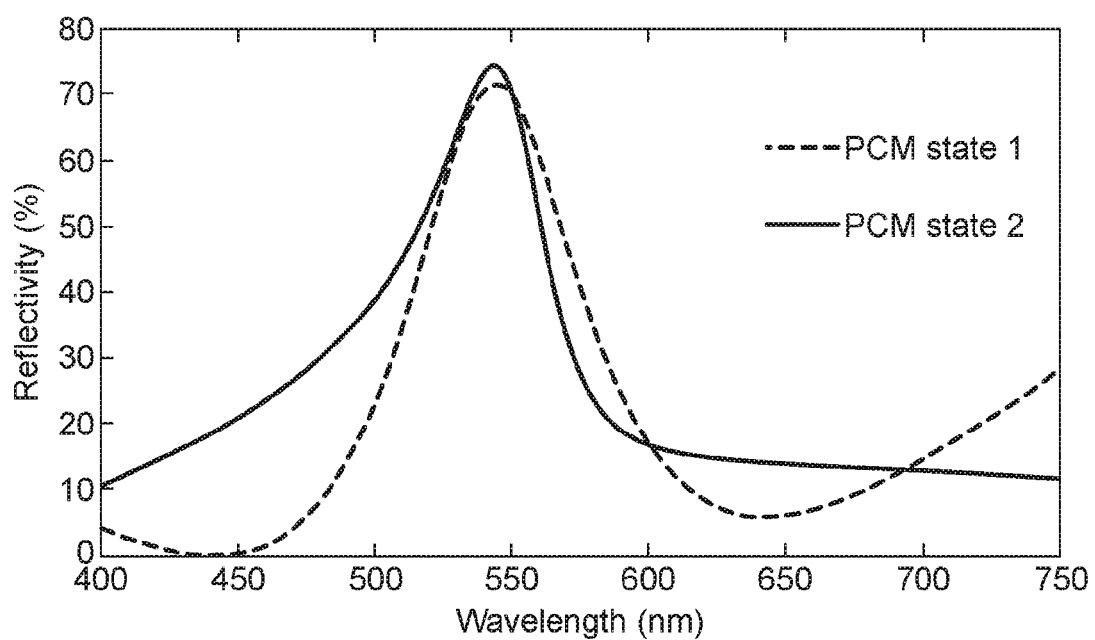
FIG. 13 is a graph showing reflectivity against wavelength for the frontplane of FIG. 12 with the optically switchable layer in two different stable states (amorphous and crystalline)
Figure 14:
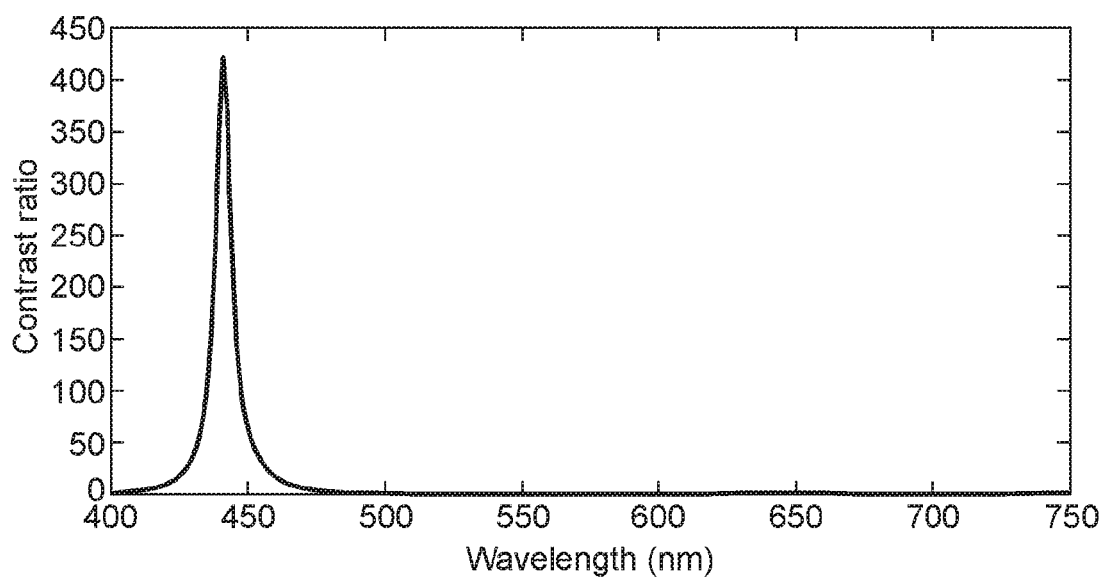
FIG. 14 is a graph showing the contrast ratio of light at visible wavelengths reflected by the apparatus of FIGS. 12 and 13 in the two states of the optically switchable layer, showing maximum contrast in a narrowband region at 450 nm.

The optical frontplane and performance described with reference to FIGS. 9-11 are exemplary only. The frontplane can be varied by using different layer thicknesses or material to achieve high contrast modulation at other wavelengths, or over a broadband range if desired. FIGS. 12-14 depict a further example optical frontplane of the apparatus 1 (FIG. 12), the corresponding variation of reflectivity with wavelength (FIG. 13), and a graph of contrast ratio against wavelength (FIG. 14). In this embodiment the stack 10 comprises a capping layer 18 formed from a single layer and a spacer layer 14 comprising three spacer layer sub-layers 141, 142 and 143. The high contrast response is provided near to 450 nm.

Figure 21:
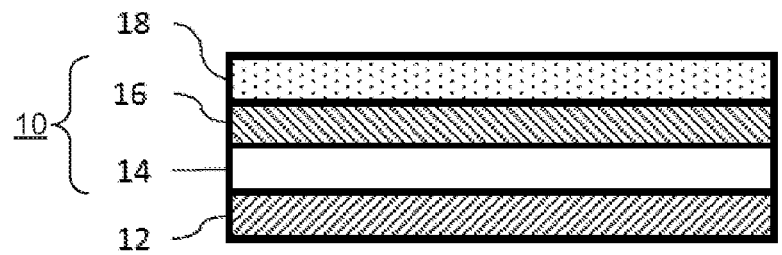
FIG. 21 depicts a further example optical frontplane.
Figure 22:
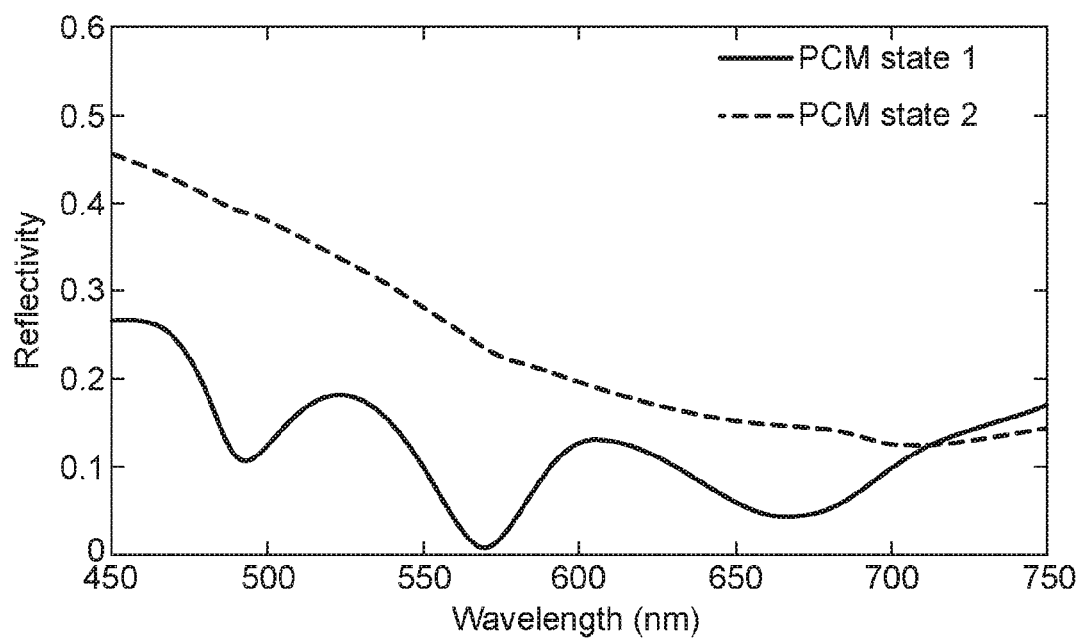
FIG. 22 is a graph showing reflectivity against wavelength for the frontplane of FIG. 21 with the optically switchable layer in two different stable states.
Figure 23:
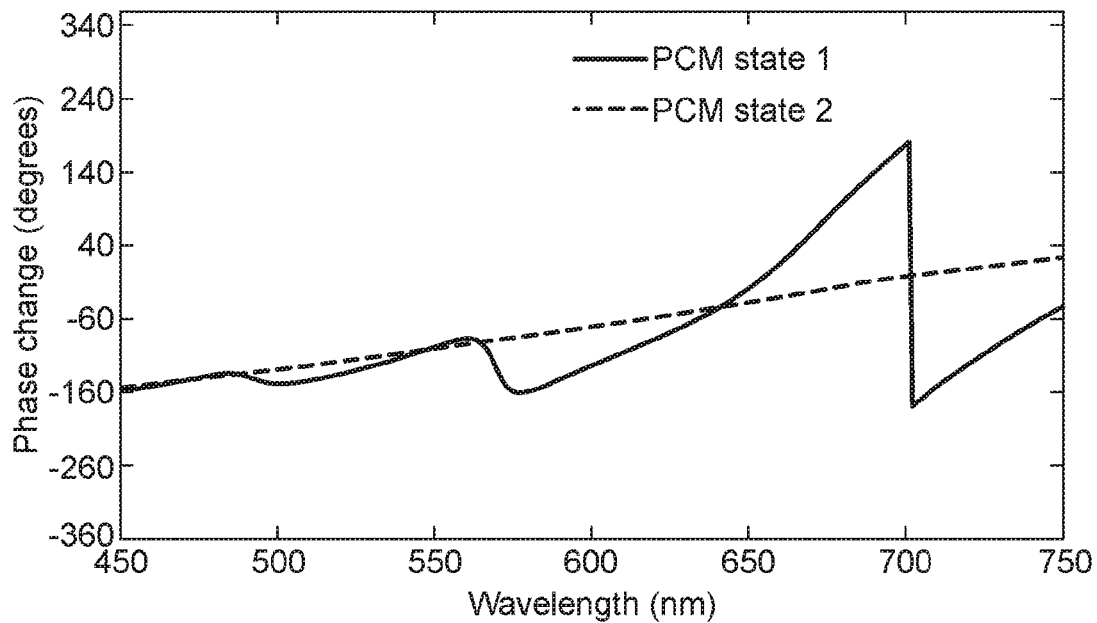
FIG. 23 is a graph showing phase change on reflection against wavelength for the frontplane of FIG. 21 with the optically switchable layer in two different stable states.
Figure 24:
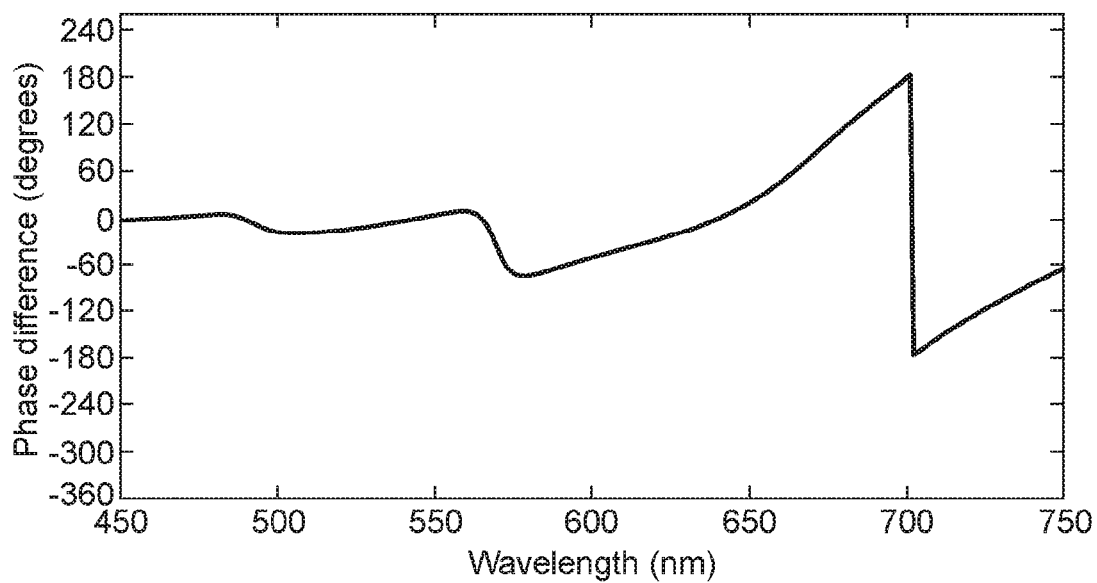
FIG. 24 is a graph showing a difference between the phase changes shown in FIG. 23 for each of the two stable states as a function of wavelength.

FIG. 21 depicts a further example optical frontplane of the apparatus 1, comprising a reflective layer 12, and a stack 10 comprising a spacer layer 14, an optically switchable layer 16, and a capping layer 18 comprising a different material to the spacer layer 14. The frontplane may be configured to optimise control of the phase change upon reflection of the incident light, for example for holographic display purposes. For holographic display purposes, it may be desirable for the light reflected in each of the two state of the PCM layer to have approximately the same amplitude, but a phase change upon reflection of pi radians (half a wavelength). In order to achieve this the spacer layer 14 and capping layer 18 may be composite layers, and/or the thickness of the individual layers may be greater than those typically used for amplitude modulation, as the overall reflectivity is of reduced importance, and longer optical path lengths within the device may be required to impart the desired phase difference. For example, the thickness of the phase change material layer 16 may be up to 100 nm, and the thickness of one or more of the spacer layer 14 and capping layer 18 may be up to 1000 nm. Resultant reflection (amplitude) spectra for the example stack design of FIG. 21 are shown in FIG. 22 (the solid line shows reflectivity as a function of wavelength for the optically switchable layer 16 in a first stable state and the broken line shows the reflectivity as a function of wavelength for the optically switchable layer 16 in a second stable state, different from the first stable state). This illustrates that while the amplitude reflectivity in each state varies significantly over the visible wavelength range, at 700 nm, the reflectivities in the first and second stable states are 10% and 12% respectively. FIG. 23 shows the phase change on reflection of the incident light, again in the two stable states. It is the difference between the two phases which will determine the amount of diffraction occurring in an input light beam reflected by pixels being configured in the two different states, and this is shown in FIG. 24. It can be seen that the difference is 180 degrees (pi radians) or half a wavelength and therefore optimal for diffractive effects at 700 nm. This illustrates that the front plane of apparatus 1 may be configured to give reasonably high reflectivity (>10%), roughly equal amplitude reflectivity (within 5%) and precisely half wavelength phase difference between the two available states for a particular narrow wavelength band, and therefore provide optimal phase-only control for diffractive or holographic effects. Alternatively, the optical frontplane may be configured to provide a higher (e.g. full wavelength) phase difference between the two stable states, and/or, as previously discussed, the device could be configured to switch to multiple intermediate states in addition to the two, fully switched conditions, giving multiple, intermediate phase difference values for further control of diffractive effects.

FIGS. 9-14 and 21-24 depict frontplanes having a single stack 10 and their corresponding performances. Where the optical frontplane has multiple stacks 10, it is possible to provide regions which provide high contrast modulation at different wavelengths (i.e. different colour regions). If the different stacks are aligned with different sets of switching elements 10, it is possible to provide a sub-pixelated full colour display via independent control of the different colour regions.

Display apparatus 1 according to various embodiments can be used as a spatial light modulator (SLM), for example as part of a microdisplay for a projection system. Example projection systems are shown in FIGS. 15-18. In such embodiments, incident light is directed to the apparatus 1 from one or more emitters in a collimated beam, optionally via some light input optical arrangement 210. Light subsequently reflected by the apparatus 1 is then collected by an output optical arrangement 212 and forms the intended image at an image replay plane 214 some distance from the apparatus 1, as in a standard projection optical system.

According to embodiments, as depicted in FIGS. 15-18, the projection system has three narrow-band illumination sources 201-203 providing red, green and blue illumination. The sources may be LED emitters, or lasers if the display is configured to provide controlled diffraction of coherent light, e.g. for holographic image reproduction. Light from the sources 201-203 may be conditioned via an input optical arrangement 210 of e.g. lenses to form a collimated beam which illuminates the full active area of the display apparatus 1 (SLM) evenly. Multiple beam splitters and/or refection elements may also be used to make light from the multiple sources 201-203 co-axial for direction onto the apparatus 1 (SLM) surface. In an embodiment, the sources 201-203 are activated sequentially in rapid succession, such that the apparatus 1 (SLM) may be configured to use its full spatial resolution to modulate the light from each source 201-203 in sequence. The viewer will see the integrated result of these temporal colour fields, giving a full-colour image.

Figure 15:
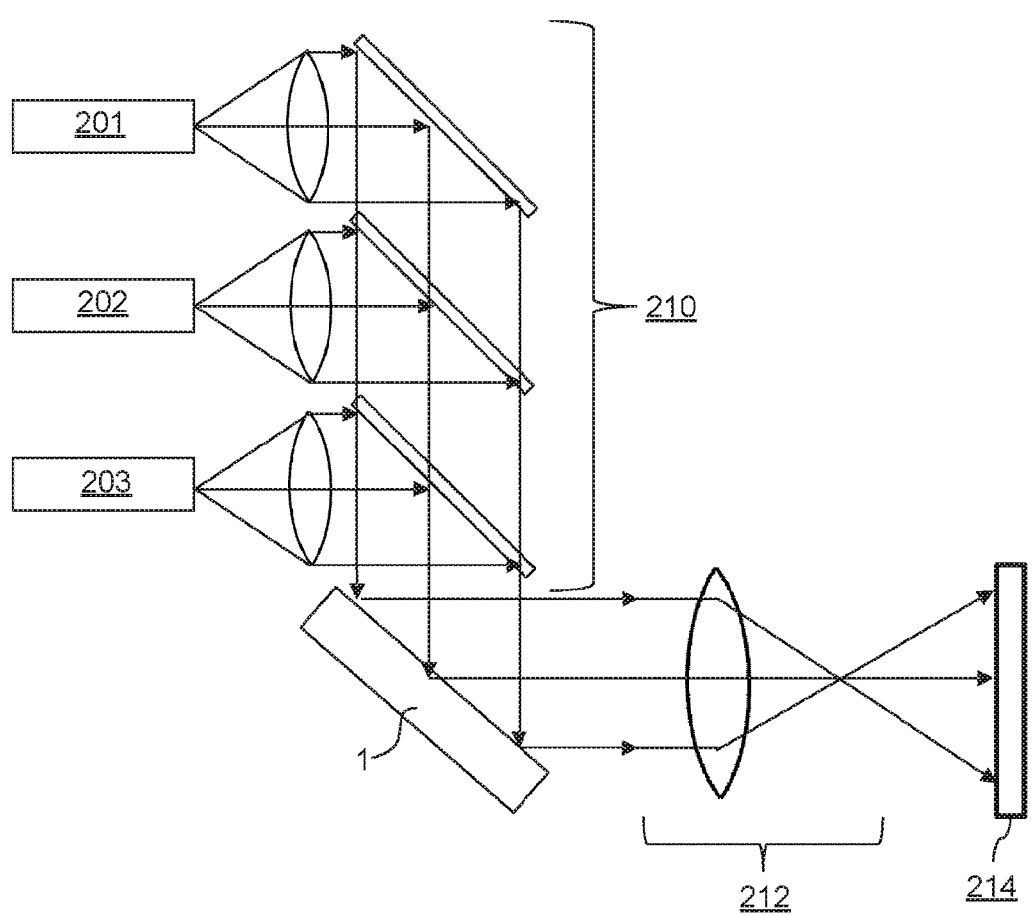
FIG. 15 depicts an optical system for 2D image projection.

The light beam reflected by the apparatus 1, having been spatially modulated according to the input data, is then optionally gathered by an output optical arrangement 212, which may provide a projection, magnification, demagnification or Fourier optics function, and the intended image is formed at a surface 214 some distance from the apparatus 1. FIG. 15 shows an example optical system of this type.

In an embodiment, the apparatus 1 (SLM) modulates the amplitude of the input beam to provide a direct representation of the intended image, and the output optics 212 then magnifies and focuses this image onto a screen at the image plane, as in a conventional projection system. In this way, each pixel in the apparatus 1 (SLM) provides modulation for each pixel in the output image and the observed image is a direct mapping of the 2D state of the SLM, as shown in FIG. 15.

Figure 16:
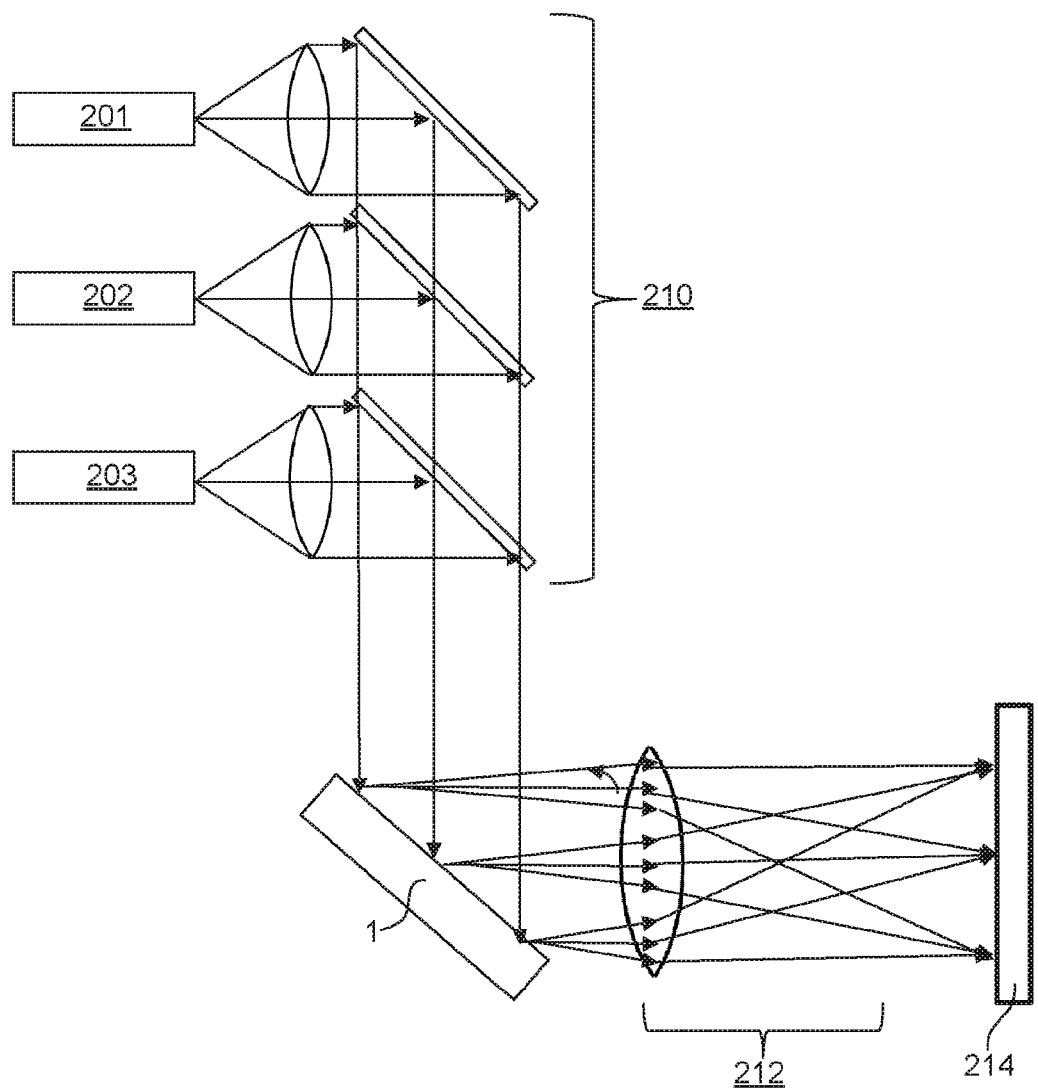
FIG. 16 depicts an optical system for holographic 2D image reproduction.

In an embodiment, the apparatus 1 (SLM) modulates the amplitude of input beams from coherent sources 201-203, such as laser diodes, and the pixels of the apparatus 1 (SLM) are now scaled to diffract the input light, and the output optics 212 are configured to act as a Fourier lens to result in a 2D holographic image at the replay field plane 214. In this way, there is no direct mapping of the state of any given pixel in the apparatus 1 (SLM) to the appearance of the image at a pixel region in the image plane, as all pixels in the apparatus 1 (SLM) contribute to the appearance of all regions of the image. FIG. 16 depicts an example of this type.

In an embodiment, the apparatus 1 (SLM) is configured to modulate the phase change on reflection of the input beams, rather than the amplitude, and again the pixels of the apparatus 1 (SLM) are now scaled to diffract the input light, and the output optics 212 are configured act as a Fourier lens to result in a 2D holographic image at the replay field plane 214. By using the apparatus 1 (SLM) to modulate only the phase of the incident light, absorption in the apparatus 1 (SLM) is minimised and it becomes possible to use almost all of the input light in the output image.

Figure 17:
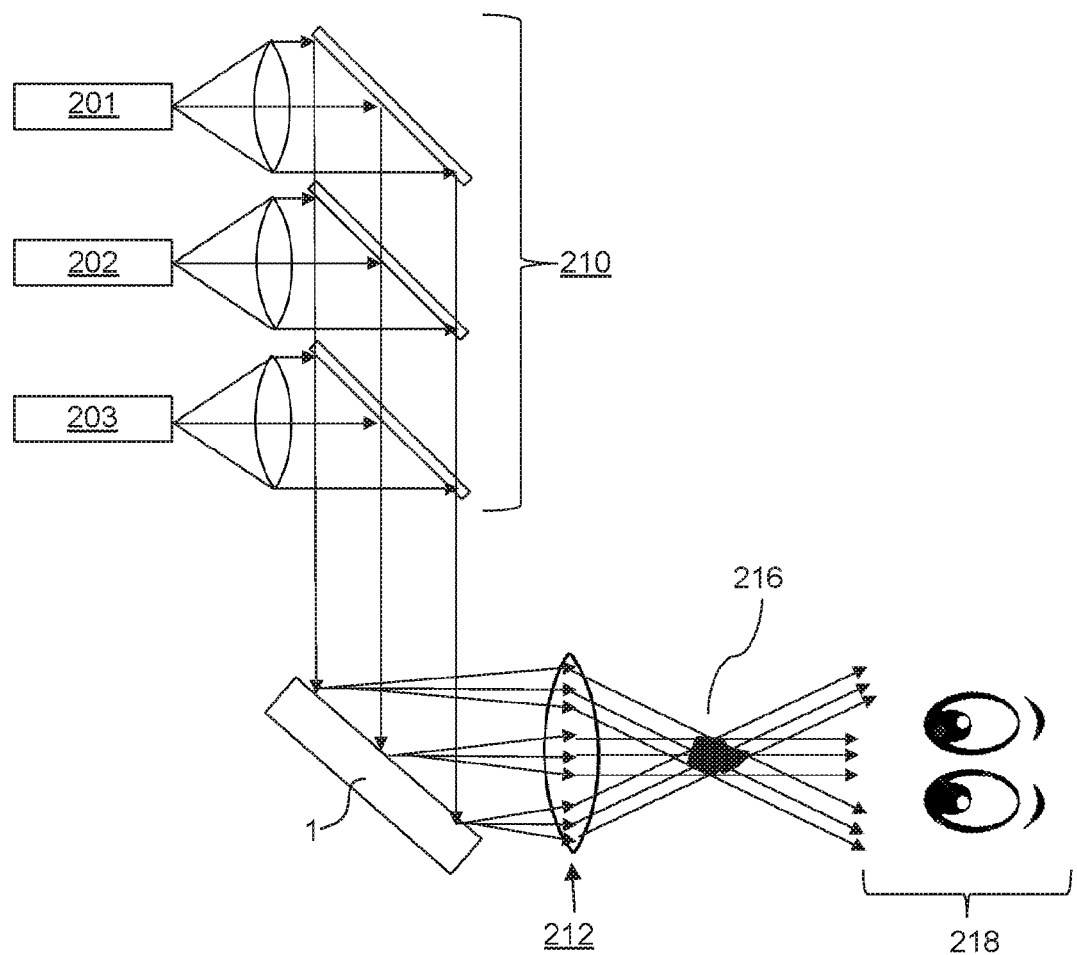
FIG. 17 depicts an optical system for holographic 3D image reproduction.

In an embodiment, the apparatus 1 (SLM) is again configured to diffract the input light beams via amplitude or phase modulation, but the pattern imposed on the apparatus 1 (SLM), rather than being calculated to result in a 2D holographic image for viewing on a screen, is configured to produce a 3D hologram with a volumetric output image 216, for direct viewing from a viewing region 218, as illustrated in FIG. 17.

Figure 18:
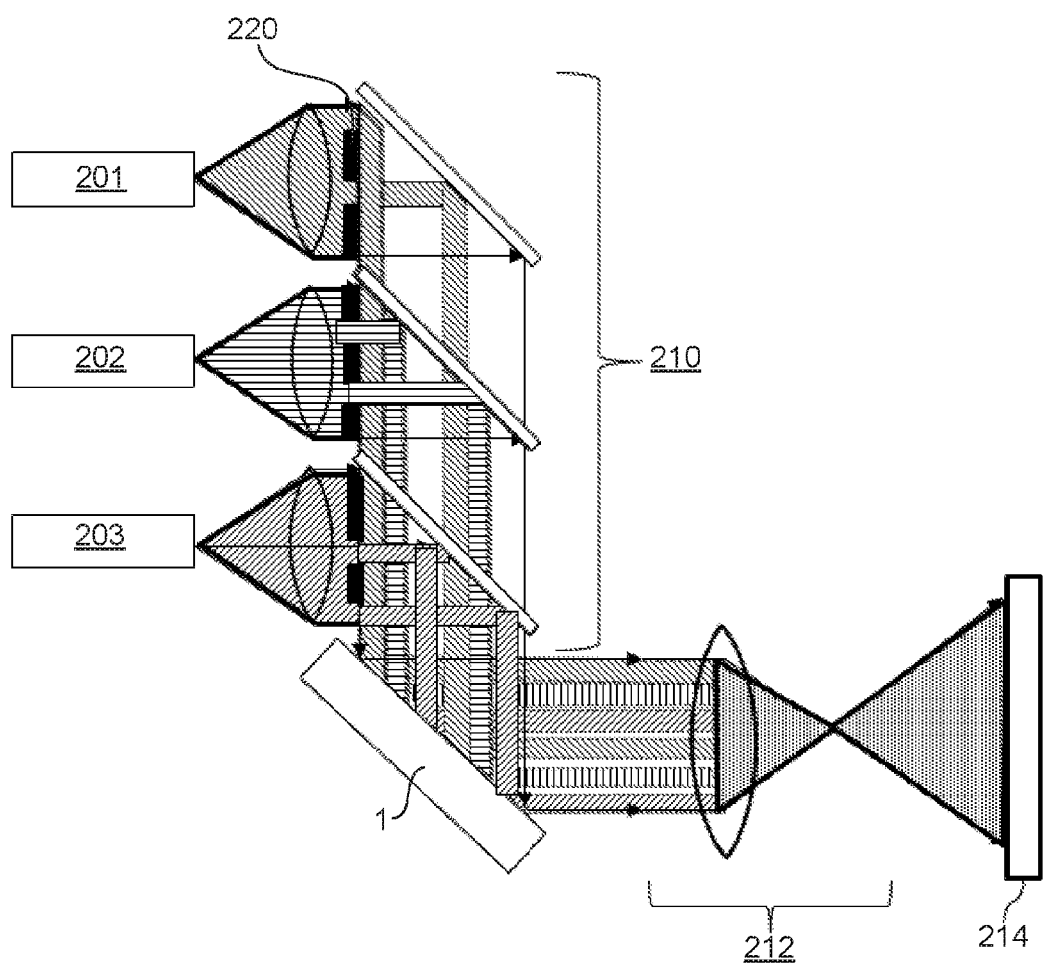
FIG. 18 depicts an optical system having multiple sets of pixel regions with different optical frontplane configurations for modulating different wavelength bands of input light, and patterned illumination of these wavelength bands from the multiple sources to the sets of pixels configured to modulate them.

In an embodiment, rather than directing light from each of the three light sources 201-203 to the whole of the active area of the apparatus 1 (SLM) and operating them in succession to provide a colour sequential image, a set of masks or reflectors 220 are used in the input optics 210 to cause light from each of the sources 201-203 to fall on a different sub-set of the pixel regions of the apparatus 1 (SLM). These sets of pixel regions may then be configured with a different optical frontplane so as to provide optimal modulation (either amplitude or phase) of light of the particular narrow wavelength band emitted by the source 201-203 illuminating each set. FIG. 18 depicts an embodiment of this type. Preferentially, the input source beams are masked to provide a series of interleaved stripes of each colour, of width matching the width of a row or column of pixels in the apparatus 1 (SLM), so as to operate as a conventional RGB striped colour display layout.

In an embodiment, three separate apparatuses 1 (SLMs) are used to modulated the light from each of the sources 201-203, the modulated beams then being superimposed to form the full colour image.

In an embodiment, the input/output systems 210, 212 are configured to produce a 3D holographic image, or sequence of 2D holographic images at different distances from the apparatus 1 (SLM).

Figure 19:
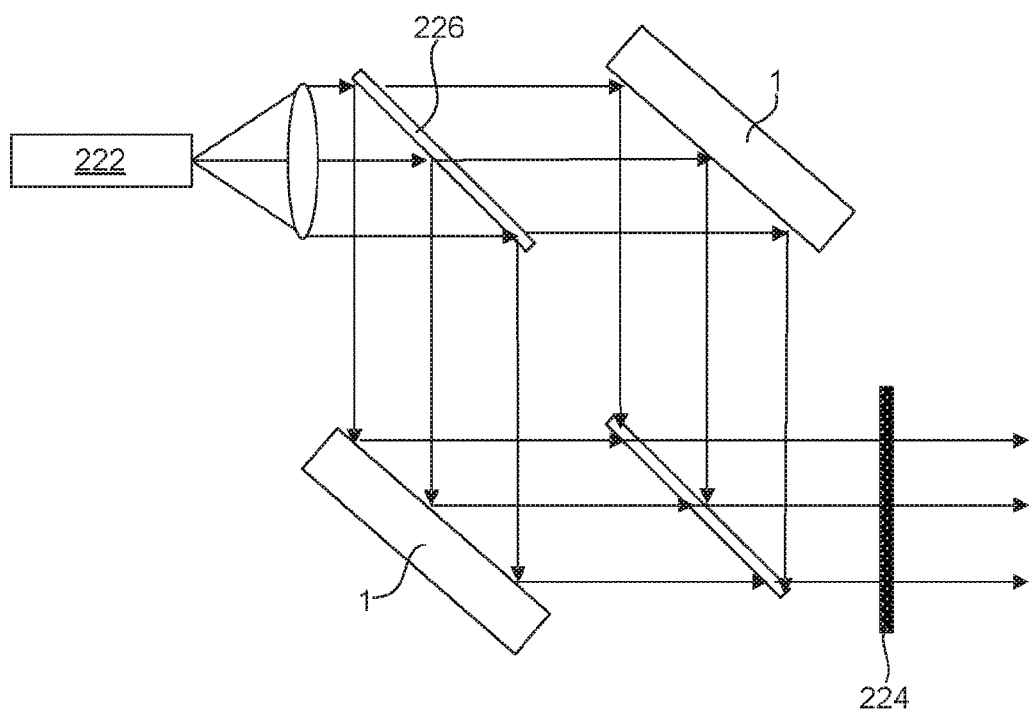
FIG. 19 depicts an optical system providing a conversion of a phase modulation applied by an embodiment (SLM), to amplitude, via the use of a polarised coherent source, beam splitting and recombination optics, and an exit polariser.

In an embodiment, an example of which is depicted in FIG. 19, the optical frontplane of the apparatus 1 is configured to provide phase modulation of input light from a coherent source 222, but the input and/or output optical arrangements now contain a polariser 224, so that the phase change imparted by the apparatus 1 is converted into an amplitude change. In order to achieve this the input optics may include a beam splitter 226 to split the light from the coherent source 222 into two orthogonal polarisation states. One or both of these may then be modulated by an apparatus 1 (SLM) of an embodiment, the other being reflected by a mirror (not shown), before being recombined so that the differential phase shift imposed on one of the beams results in a rotation and/or a change of ellipticity of the polarisation state. In order to expand the range of available phase shifts which may be applied to the beam, a second apparatus 1 (SLM) of an embodiment may be used instead of the mirror, as in the example of FIG. 19, so that each orthogonally polarised beam may be independently phase modulated in a spatially controlled manner.

Figure 20:
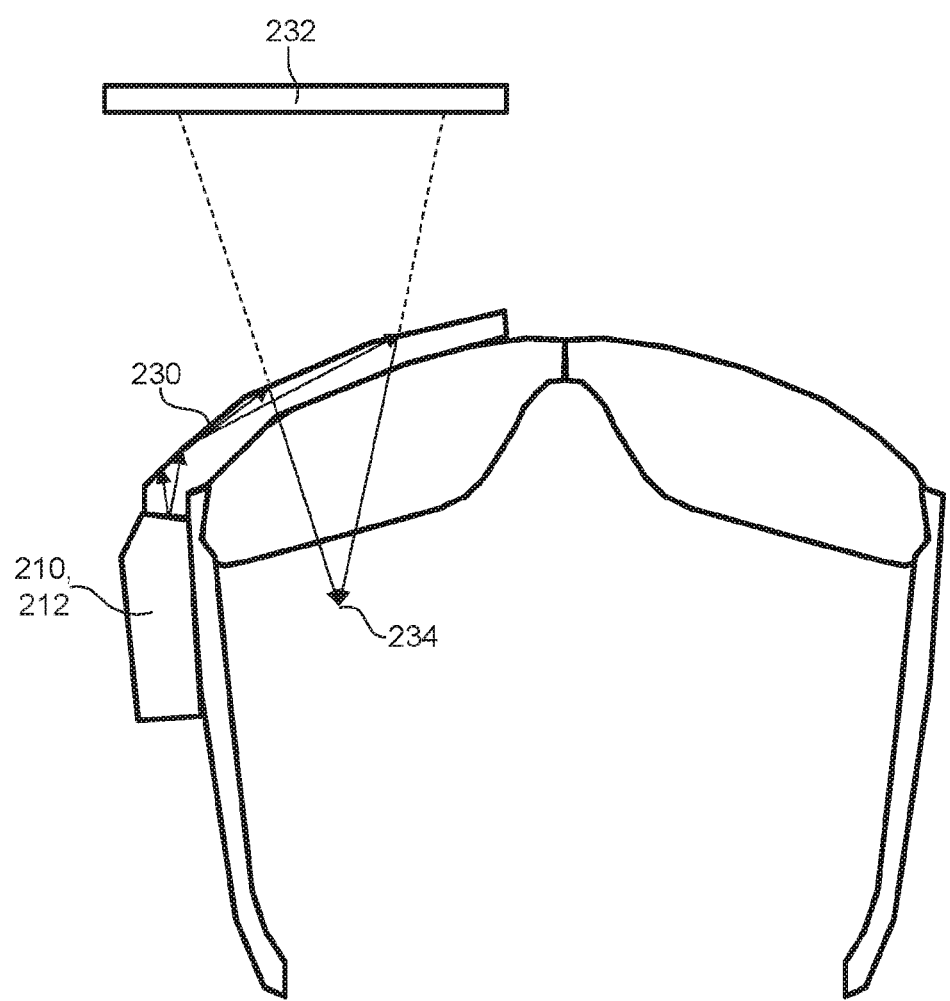
FIG. 20 depicts a display apparatus implemented as part of a head mounted display with a transparent screen or waveguide.

In an embodiment, the projection system using the apparatus 1 forms part of a head-up display or head mounted display for driver information in a vehicle, augmented reality or virtual reality headsets. An example of an arrangement usable in a heat mount display arrangement is depicted in FIG. 20. In these instances, the screen at the image plane may be replaced with a transparent or partially transparent screen 230 on which the viewable image is formed, or which redirects the light so as to form a virtual image 232 behind the transparent screen 230 (viewable from eye point 234), or a real image in front of it. In the instance that the transparent screen is a waveguide, diffractive features may be included in the waveguide to provide beam expansion and focusing properties, such that the waveguide may provide the lensing function of the output optics as per FIGS. 15-18, allowing 3D image capability via the transparent screen 230

In the above embodiments, the one or more stacks 10 each comprise only a single optically switchable layer 16 (e.g. PCM). This is not essential. In other embodiments, plural optically switchable layers may be provided. The additional optically switchable layer or layers may enhance the contrast or expand the range of possible colours producible by the display. The plural optically switchable layers may for example comprise a switchable attenuator. Where a plurality of stacks 10 are provided, switchable attenuator layers in different stacks together provide a pixelated switchable attenuator. The pixelated switchable attenuator may be positioned above other optically switchable layers (e.g. PCM) and in registration with the switching elements 20.

The optical frontplane may be provided with two or more optically switchable layers 16 that each comprise PCM, so as to allow switching of each pixel region in the apparatus 1 between three or more different states, each giving a different reflectivity or phase change for the input light beams. For example, two PCM layers may be used each of which may be switched independently to give four different states corresponding to the combinations of the two states of each layer. Alternatively, it may not be possible to switch one of the layers into a particular state without switching the other layer into the same state, in which case three different states may be accessible for each pixel region.

The display apparatus 1 may be utilised in any product in which it is desired to provide a viewable image or other spatially controlled phase or amplitude modulation of an input light beam, using for example an SLM. Such products include so-called pico-projectors, head-up displays, head-mounted displays, augmented and virtual reality headsets, holographic projection devices, beam steerers, optical interconnects and multiplexers, and optical correlators. The display apparatus 1 may also be used to form part of a security document. The display apparatus 1 may be used in an active state (e.g. SLM) or passive (e.g. security document).

The invention claimed is:

1. A display apparatus, comprising:
   a reflective layer comprising reflective material, and one or more stacks of additional layers provided on the reflective layer, wherein each stack comprises an optically switchable layer; and
   a plurality of switching elements located on a side of the reflective layer opposite to the one or more stacks or forming part of the reflective layer, each switching element being operable to apply heating to a switchable portion of the optically switchable layer and thereby change an appearance of the switchable portion when viewed from a viewing side of the display apparatus, wherein:

the apparatus is configured to apply the heating by driving an electrical current through the switching element to generate Joule heating in the switching element, wherein the electrical current flows in an electrical circuit comprising a portion of the reflective layer, and the reflective layer comprises a pattern of regions of different thermal conductivity, the pattern being such as to increase the thermal resistance between each region of the reflective layer that corresponds to a switching element and each region of the reflective layer that corresponds to a different switching element.

2. The apparatus of claim 1, wherein each switching element comprises a resistive component in series with the portion of the reflective layer.

3. The apparatus of claim 2, wherein the resistive component is positioned behind the reflective layer when viewed from the viewing side of the display apparatus.

4. The apparatus of claim 2, configured such that when an electrical current is being driven through the resistive component to drive the switching element, Joule heating associated with the electrical current is higher in the resistive component than in the reflective layer.

5. The apparatus of claim 1, wherein each region corresponding to a switching element comprises an inner sub-region surrounded by a thermally insulating region that surrounds only that inner sub-region, wherein the average thermal conductivity of the material or materials forming the inner sub-region is higher than the average thermal conductivity of the material or materials forming the thermally insulating region surrounding the inner sub-region.

6. The apparatus of claim 1, wherein the inner sub-region predominantly comprises a metallic material and the thermally insulating region predominantly comprises a non-metallic material having a lower thermal conductivity than the metallic material.

7. The apparatus of claim 1, wherein the reflective layer is patterned so that each switching element comprises a localized path of high electrical resistance formed within the reflective layer, the localized path being such that at least 25% of the Joule heating provided by the switching element is provided by Joule heating within the localized path.

8. The apparatus of claim 1, wherein the optically switchable layer is configured such that switching of the optically switchable layer causes the apparatus to provide one or both of the following effects for incident radiation within a predetermined frequency range:
  i) a change in reflectivity of a factor of at least 50; or
  ii) a change in phase that is within 5% of $n\pi/2$ radians, where n is an integer.

9. The apparatus of claim 8, wherein the predetermined frequency range has a bandwidth of less than 100 nm.

10. The apparatus of claim 9, wherein the effect (i) and effect (ii) are not provided for incident radiation outside of the predetermined frequency range.

11. The apparatus of claim 1, wherein the optically switchable layer comprises a phase change material, the phase change material being switchable between a plurality of stable states, each of the stable states having a different refractive index relative to each of the other stable states.

12. The apparatus of claim 11, wherein the phase change material is switchable by application of heat between the plurality of stable states.

13. The apparatus of claim 11, wherein the phase change material comprises one or more of the following:
  an oxide of vanadium;
  an oxide of niobium;
  an alloy or compound comprising Ge, Sb, and Te;
  an alloy or compound comprising Ge and Te;
  an alloy or compound comprising Ge and Sb;
  an alloy or compound comprising Ga and Sb;
  an alloy or compound comprising Ag, In, Sb, and Te;
  an alloy or compound comprising In and Sb;
  an alloy or compound comprising In, Sb, and Te;
  an alloy or compound comprising In and Se;
  an alloy or compound comprising Sb and Te;
  an alloy or compound comprising Te, Ge, Sb, and S;
  an alloy or compound comprising Ag, Sb, and Se;
  an alloy or compound comprising Sb and Se;
  an alloy or compound comprising Ge, Sb, Mn, and Sn;
  an alloy or compound comprising Ag, Sb, and Te;
  an alloy or compound comprising Au, Sb, and Te; and
  an alloy or compound comprising Al and Sb.

14. The apparatus of claim 11, wherein the phase change material comprises one of GeTe, Ge2Sb2Te5 and Ag3In4Sb76Te17.

15. The apparatus of claim 1, further comprising an integrated circuit layer formed on a side of the reflective layer opposite to the one or more stacks, the integrated circuit layer comprising at least one integrated circuit chip that comprises one or more of: 1) all or a portion of each of a plurality of the switching elements; 2) electronics for driving a plurality of the switching elements.

16. The apparatus of claim 1, wherein the reflective layer is metallic.

17. The apparatus of claim 1, wherein each of the one or more stacks of additional layers further comprises a spacer layer, each spacer layer being provided between the reflective layer and the optically switchable layer that is in the same stack as the spacer layer.

18. The apparatus of claim 1, wherein each of the one or more stacks of additional layers further comprises a capping layer, wherein the optically switchable layer in each stack is provided between the capping layer and the reflective layer.

19. A spatial light modulator comprising the apparatus of claim 1.

20. A projection system comprising the spatial light modulator of claim 19.

21. A security document comprising the apparatus of claim 1.

* * * * *